United States Patent
Yu

(10) Patent No.: US 10,153,328 B2
(45) Date of Patent: Dec. 11, 2018

(54) OLED DISPLAY PANLE AND A PACKAGE METHOD

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 195 days.

(21) Appl. No.: 14/770,954

(22) PCT Filed: Jul. 22, 2015

(86) PCT No.: PCT/CN2015/084765
§ 371 (c)(1),
(2) Date: Aug. 27, 2015

(87) PCT Pub. No.: WO2017/004853
PCT Pub. Date: Jan. 12, 2017

(65) Prior Publication Data
US 2017/0005143 A1   Jan. 5, 2017

(30) Foreign Application Priority Data
Jul. 3, 2015 (CN) .......................... 2015 1 0391969

(51) Int. Cl.
| | | |
|---|---|---|
| H01L 21/00 | (2006.01) | |
| H01L 27/32 | (2006.01) | |
| H01L 51/52 | (2006.01) | |
| H01L 51/56 | (2006.01) | |

(52) U.S. Cl.
CPC ............ *H01L 27/32* (2013.01); *H01L 51/524* (2013.01); *H01L 51/56* (2013.01); *H01L 2251/301* (2013.01)

(58) Field of Classification Search
CPC ...................................................... H01L 27/32
USPC ............................................................ 257/40
See application file for complete search history.

(56) References Cited

U.S. PATENT DOCUMENTS

| | | | |
|---|---|---|---|
| 9,066,386 | B2 | 6/2015 | Han et al. |
| 9,391,298 | B2 | 7/2016 | Xie |
| 9,559,331 | B2 | 1/2017 | Zeng et al. |
| 9,722,214 | B2 | 8/2017 | Sun |

(Continued)

FOREIGN PATENT DOCUMENTS

| | | | |
|---|---|---|---|
| CN | 1617635 A | 5/2015 | |
| CN | 1617636 A | 5/2015 | |

*Primary Examiner* — Ajay K Arora
(74) *Attorney, Agent, or Firm* — Andrew C. Cheng

(57) ABSTRACT

The present invention is to provide an Organic Light-Emitting Diode (OLED) display panel and a package method thereof. The method includes forming simultaneously a supporter and a hydrophobic wall on an outer position of and enclosing the OLED device by screen printing, wherein the hydrophobic wall is on an outer position of the supporter; and bonding the cover plate and the OLED substrate. The present invention can effectively protect the OLED device from outer moisture and oxygen to improve package effect and increase life of the OLED device. The supporter and the hydrophobic wall are formed simultaneously by screen printing so the method is simple and the manufacturing efficiency is improved.

17 Claims, 2 Drawing Sheets

(56) References Cited

U.S. PATENT DOCUMENTS

| | | | | |
|---|---|---|---|---|
| 2009/0135356 A1* | 5/2009 | Ando | ............... | B82Y 20/00 |
| | | | | 349/137 |
| 2009/0267075 A1 | 10/2009 | Wang et al. | | |
| 2012/0261713 A1* | 10/2012 | Koo | ............... | H01L 51/524 |
| | | | | 257/100 |
| 2014/0319998 A1* | 10/2014 | Han | ............... | H05B 33/04 |
| | | | | 313/504 |
| 2015/0062524 A1* | 3/2015 | Kim | ............... | G02F 1/1339 |
| | | | | 349/153 |
| 2015/0111328 A1* | 4/2015 | Huang | ............... | H01L 33/50 |
| | | | | 438/27 |
| 2016/0104861 A1* | 4/2016 | Zeng | ............... | H01L 51/56 |
| | | | | 257/40 |
| 2016/0155988 A1* | 6/2016 | Kuroki | ............... | H01L 51/0097 |
| | | | | 257/40 |
| 2016/0248016 A1 | 8/2016 | Liu | | |

* cited by examiner

OLED DISPLAY PANLE AND A PACKAGE METHOD

BACKGROUND

Technical Field

The present invention relates to display field, and more particularly, to an Organic Light-Emitting Diode (OLED) display panel and a package method thereof.

Description of Related Art

An Organic Light-Emitting Diode (OLED) display is a display of new generation. An organic thin film is formed on an OLED substrate and between an anode and a cathode. Forward voltage is applied to the anode and the cathode and the organic thin film emits light. The organic thin film is sensitive to the moisture and oxygen and thus degenerates. Brightness and life of the OLED device apparently decays. Therefore, the OLED device needs package process. The conventional package method includes coating UV glue on the periphery of the cover plate, bonding the OLED substrate and the cover plate, forming a hermetic space among two glass substrates and support elements formed by the UV glue, and setting the organic thin film in the hermetic space. Because ability of support elements preventing moisture and oxygen is bad, moisture and oxygen can penetrate into the hermetic space via the support elements. The performance of the organic thin film is influenced.

SUMMARY

The present invention is to provide an Organic Light-Emitting Diode (OLED) display panel and a package method thereof, for blocking moisture and oxygen from penetrate into the hermetic space and influencing the performance of the organic thin film. The package effect is improved and the life of the OLED device is increased.

For solving the aforementioned problem, the present invention provides a method of packaging an OLED display panel including providing a cover plate and an OLED substrate, wherein an OLED device is set on the OLED substrate; forming simultaneously a supporter and a hydrophobic wall on an outer position of and enclosing the OLED device by screen printing, wherein width of the hydrophobic wall is 100-2000 µm; and bonding the cover plate and the OLED substrate; wherein the method of forming simultaneously the supporter and the hydrophobic wall includes providing a screen printing template having two pattern openings, wherein the shapes of the two openings are corresponding to that of the supporter and the hydrophobic wall; setting the materials of the supporter and the hydrophobic wall on the screen printing template respectively; and scraping the materials of the supporter and the hydrophobic wall on the screen printing template by scraper to coat the materials into the corresponding openings.

A material of the hydrophobic wall is solution, and after bonding the cover plate and the OLED substrate, the method further includes curing a material of the supporter by UV ray; and drying the cured supporter and a solution of the hydrophobic wall.

The solution is an organic silicon solution including long chain silane coupling agent and a solution of fluorinated alkyl triethoxysilane.

The solution is a combination of an organic solution and a solution of inorganic compound, wherein the organic solution comprises solution of the precursor having alkoxides of silicon, Titanium, tin, aluminum, or zirconium.

For solving the aforementioned problem, the present invention provides another method of packaging an OLED display panel including providing a cover plate and an OLED substrate, wherein an OLED device is set on the OLED substrate; forming simultaneously a supporter and a hydrophobic wall on an outer position of and enclosing the OLED device by screen printing, wherein the hydrophobic wall is on an outer position of the supporter; and bonding the cover plate and the OLED substrate.

The method of forming simultaneously the supporter and the hydrophobic wall includes providing a screen printing template having two pattern openings, wherein the shapes of the two openings are corresponding to that of the supporter and the hydrophobic wall; setting the materials of the supporter and the hydrophobic wall on the screen printing template respectively; and scraping the materials of the supporter and the hydrophobic wall on the screen printing template by scraper to coat the materials into the corresponding openings.

A material of the hydrophobic wall is solution, and after bonding the cover plate and the OLED substrate, the method further includes curing a material of the supporter by UV ray; and drying the cured supporter and a solution of the hydrophobic wall.

The solution is an organic silicon solution comprising long chain silane coupling agent and a solution of fluorinated alkyl triethoxysilane.

The solution is a combination of an organic solution and a solution of inorganic compound, wherein the organic solution comprises solution of the precursor having alkoxides of silicon, Titanium, tin, aluminum, or zirconium.

The width of the hydrophobic wall is 100-2000 µm.

For solving the aforementioned problem, the present invention provides an OLED display panel including an OLED substrate, wherein an OLED device is formed on the OLED substrate; a cover plate; a supporter, printed on the cover plate by screen printing and located on an outer position of the OLED device, wherein the supporter encloses the OLED device when the OLED substrate and the cover plate are bonded; and a hydrophobic wall, printed on the cover plate by screen printing and located on an outer position of the supporter, wherein the hydrophobic wall encloses the supporter.

The solution is an organic silicon solution comprising long chain silane coupling agent and a solution of fluorinated alkyl triethoxysilane.

The solution is a combination of an organic solution and a solution of inorganic compound, wherein the organic solution comprises solution of the precursor having alkoxides of silicon, Titanium, tin, aluminum, or zirconium.

The width of the hydrophobic wall is 100-2000 µm.

The benefit of the present invention is that the supporter and the hydrophobic wall are printed simultaneously on the outer position of the OLED device by screen printing, wherein the hydrophobic wall is set on outer position of the supporter 13 to block moisture and oxygen from contacting the OLED device. The organic thin film of the OLED device is particularly influenced and the package effect is improved and the life of the OLED device is increased. Furthermore, the supporter and the hydrophobic wall are formed simultaneously so this method is easy and efficiency is improved.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure.

Figure 1:
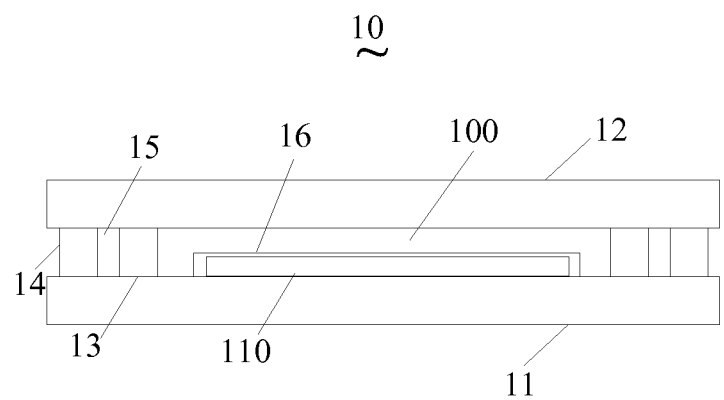
FIG. 1 is a schematic diagram of a structure of an OLED display panel in accordance with an embodiment of the present invention.

FIG. 1 is a schematic diagram of a structure of an OLED display panel in accordance with an embodiment of the present invention. The OLED display panel 10 includes an OLED substrate 11, a cover plate 12, a supporter 13, and a hydrophobic wall 14, wherein an OLED device 110 is formed on the OLED substrate 11.

Figure 2:
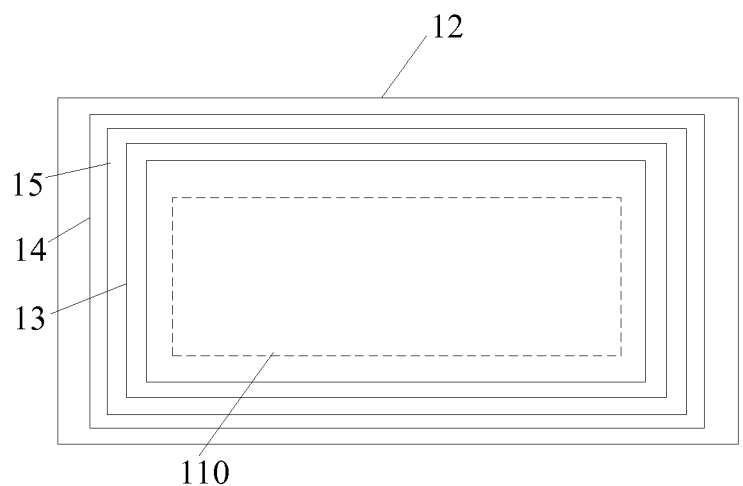
FIG. 2 is a schematic diagram of a structure of a cover plate of an OLED display panel in accordance with an embodiment of the present invention.

Referring to FIG. 2 which is a schematic diagram of a structure of the cover plate 12, the supporter 13 is printed on the cover plate 12 by screen printing and located on outer position of the OLED device 110. The supporter 13 encloses the OLED device 110 when the OLED substrate 11 and the cover plate 12 are bonded. The hydrophobic wall 14 is printed on the cover plate 12 by screen printing and located on outer position of the supporter 13. The hydrophobic wall 14 encloses the supporter 13. Both the supporter 13 and the hydrophobic wall 14 are formed simultaneously by screen printing.

Referring to FIG. 1, the OLED substrate 11 is formed opposite to the cover plate 12. The supporter 13 and the hydrophobic wall 14 are set between the OLED substrate 11 and the cover plate 12 respectively, wherein the supporter 13 and the hydrophobic wall 14 have the same height so a hermetic space 100 is formed between the OLED substrate 11 and the cover plate 12. The hydrophobic wall 14 can effectively block the entrance of outer moisture and oxygen into the hermetic space 100 and protect the organic thin film of the OLED device 110 from contacting moisture and oxygen and influencing performance. The package effect is improved and life of the OLED device 110 is prolonged.

In addition, the hydrophobic wall 14 is set on outer position of the supporter 13 to avoid that the hydrophobic wall 14 scratches the OLED device 110.

Moreover, both the supporter 13 and the hydrophobic wall 14 are formed by screen printing. The method is simple and the number of the apparatus needed is less so cost of this invention is lower.

Furthermore, the supporter 13 and the hydrophobic wall 14 are formed simultaneously so the manufacturing time is saved and the efficiency is improved.

The supporter 13 is made of glue material or glass material. The material of the hydrophobic wall 14 is solution which includes two kinds of solutions below.

The first solution is organic silicon solution which is formed by the precursor having stronger hydrophobic side chains. The organic silicon solution includes long chain silane coupling agent and the solution of fluorinated alkyl triethoxysilane.

The second solution is a combination of organic solution and the solution of inorganic compound, wherein the organic solution includes solution of the precursor having alkoxides of silicon, Titanium, tin, aluminum, or zirconium.

In this embodiment, width of the hydrophobic wall 14 is preferably 100-2000 μm.

In addition, exothermic layers 15 are set on the inner positions of the supporter 13 and the hydrophobic wall 14 respectively. The exothermic layer 15 release large heat when countering water. The material of the exothermic layer 15 can be one of the sodium and magnesium. It can be understood that the material of the exothermic layer 15 can be other material. The material of the exothermic layer 15 is chosen according to the melting point of the supporter 13 and the hydrophobic wall 14.

The package of the OLED display panel 10 is performed in vacuum so the exothermic layers 15 do not react with oxygen and are successfully set on the predetermined positions of the supporter 13 and the hydrophobic wall 14. After the OLED display panel 10 is utilized for a period of time or the package of the OLED display panel 10 is not an ideal state, the supporter 13 or the hydrophobic wall 14 could include cracks or bubbles and moisture enters into hermetic space 100 of the OLED display panel 10. The exothermic layers 15 meet moisture and release large heat. The supporter 13 and the hydrophobic wall 14 reach molten state again, and the fluid material of the supporter 13 or the hydrophobic wall 14 can refill and seal the cracks and the regions where moisture can pass. Thus, the OLED display panel 10 has auto-repair function and the life thereof is increased.

Furthermore, the OLED display panel 10 further includes a moisture-proof layer 16 to protect the organic thin film of the OLED device 110 from moisture. Specifically, the moisture-proof layer 16 is sprayed on the OLED device 110 and covers the whole OLED substrate 11. The moisture-proof layer 16 can cover the OLED device 110 only as well. The moisture-proof layer 16 can be desiccant thin film. The desiccant can be chemical desiccant or physical desiccant. The OLED device 110 can further have water-proof protection.

Figure 3:
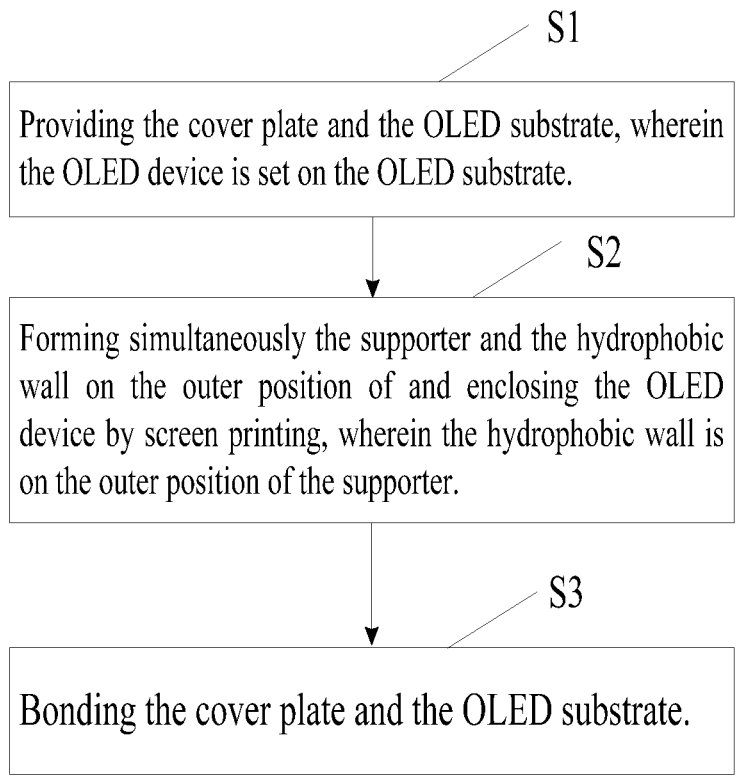
FIG. 3 is a flow chart of package method of an OLED display panel in accordance with an embodiment of the present invention.

The present invention also provides a package method of an OLED display panel, wherein the OLED display panel is the aforementioned OLED display panel 10. FIG. 3 is a flow chart of a package method of an OLED display panel in accordance with an embodiment of the present invention. Referring to FIGS. 1-3, the package method of the OLED display panel 10 in accordance with the present invention includes:

Step S1: providing the cover plate 12 and the OLED substrate 11, wherein the OLED device 110 is set on the OLED substrate 11.

In this step, after setting the OLED device 110 on the OLED substrate 11, it further includes electrifying the OLED device 110 to burn the residual particles. This specific step includes This specific step includes putting the OLED substrate 11 in a deposition chamber of vacuum and completing the deposition of the OLED device 110. The OLED device 110 is taken out and electrified with a predetermined period. The electrifying has two stages including applying constant direct current with one minute and varying voltage to scan with one minute. Applying constant direct current includes electrifying the OLED device 110 by 7V with 30 seconds and by −15V with 30 seconds. Varying voltage to scan includes electrifying the OLED device 110 by −15V-10V in 5 continuous circles with 40 seconds, wherein the varying amount is 1V; and electrifying the OLED device 110 by 0V-7V in 10 continuous circles with 20 seconds, wherein the varying amount is 1V.

After electrifying, the short problem of the OLED device 110 caused by the residual particles can be improved effectively so the yield and the reliability of the OLED device 110 can be promoted.

Step S2: forming simultaneously the supporter 13 and the hydrophobic wall 14 on the outer position of and enclosing the OLED device 110 by screen printing, wherein the hydrophobic wall 14 is on the outer position of the supporter 13.

Figure 4:
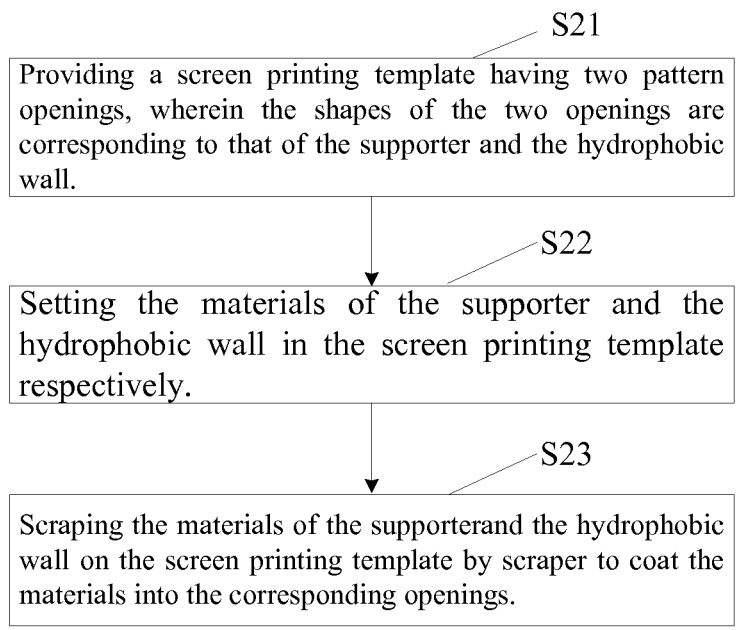
FIG. 4 is a flow chart of package method of an OLED display panel in accordance with another embodiment of the present invention.

Referring to FIG. 4 which is a flow chart of the step S2 in accordance with the present invention, the method includes the steps below:

S21: providing a screen printing template having two pattern openings, wherein the shapes of the two openings are corresponding to that of the supporter 13 and the hydrophobic wall 14;

S22: setting the materials of the supporter 13 and the hydrophobic wall 14 in the screen printing template respectively;

S23: scraping the materials of the supporter 13 and the hydrophobic wall 14 on the screen printing template by scraper to coat the materials into the corresponding openings.

The supporter 13 is made of glue material or glass material. The material of the hydrophobic wall 14 is solution which includes two kinds of solutions below:

The first solution is organic silicon solution which is formed by the precursor having stronger hydrophobic side chains. The organic silicon solution includes long chain silane coupling agent and the solution of fluorinated alkyl triethoxysilane.

The second solution is a combination of organic solution and the solution of inorganic compound, wherein the organic solution includes solution of the precursor having alkoxides of silicon, Titanium, tin, aluminum, or zirconium.

S3: bonding the cover plate 12 and the OLED substrate 11.

After this step, the glue material of the supporter 13 is irradiated for curing by ultraviolet (UV) ray. Specifically, the place except the supporter 13 is covered by a mask and the position of the supporter 13 is not covered. The position of the supporter 13 is irradiated by UV ray to cure the supporter 13.

After curing, the cured supporter 13 and the solution of the hydrophobic wall 14 are dried to seal the space between the cover plate 12 and the OLED substrate 11 and form the hermetic space 100, wherein width of the hydrophobic wall 14 is 100-2000 μm.

Because the method of screen printing only has two steps of coating and drying, the art of the present invention setting the supporter 13 and the hydrophobic wall 14 is simple.

Moreover, screen printing only needs the apparatus such as the screen printing template, the scraper, and the dryer so the cost is lower.

Furthermore, the present invention provides that the supporter 13 and the hydrophobic wall 14 are formed simultaneously by screen printing so the manufacturing efficiency is improved.

In addition, in the step S2, exothermic layers 15 are set on the inner positions of the supporter 13 and the hydrophobic wall 14 respectively. The exothermic layer 15 release large heat when countering water. The material of the exothermic layer 15 can be one of the sodium and magnesium. It can be understood that the material of the exothermic layer 15 can be other material. The material of the exothermic layer 15 is chosen according to the melting point of the supporter 13 and the hydrophobic wall 14.

The package of the OLED display panel 10 is performed in vacuum so the exothermic layers 15 do not react with oxygen and are successfully set on the predetermined positions of the supporter 13 and the hydrophobic wall 14. After the OLED display panel 10 is utilized for a period of time or the package of the OLED display panel 10 is not an ideal state, the supporter 13 or the hydrophobic wall 14 could include cracks or bubbles and moisture enters into hermetic space 100 of the OLED display panel 10. The exothermic layers 15 meet moisture and release large heat. The supporter 13 and the hydrophobic wall 14 reach molten state again, and the fluid material of the supporter 13 or the hydrophobic wall 14 can refill and seal the cracks and the regions where moisture can pass. Thus, the OLED display panel 10 has auto-repair function and the life thereof is increased.

Furthermore, the OLED display panel 10 further includes a moisture-proof layer 16 to protect the organic thin film of the OLED device 110 from moisture. Specifically, the moisture-proof layer 16 is sprayed on the OLED device 110 and covers the whole OLED substrate 11. The moisture-proof layer 16 can cover the OLED device 110 only as well. The moisture-proof layer 16 can be desiccant thin film. The desiccant can be chemical desiccant or physical desiccant. The OLED device 110 can further have water-proof protection. Because the moisture-proof layer 16 is formed by spray, the method is easier and faster and the package efficiency of the OLED device is improved, comparing to the conventional CVD.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of packaging an organic light-emitting diode (OLED) display panel, comprising:

providing a cover plate and an OLED substrate, wherein an OLED device is set on the OLED substrate;

forming a supporter and a hydrophobic wall on an outer position of and enclosing the OLED device by screen printing, setting exothermic layers on inner positions of the supporter and the hydrophobic wall respectively, wherein the exothermic layers are sandwiched by the OLED substrate, and the cover plate, wherein width of the hydrophobic wall is 100-2000 μm; and bonding the cover plate and the OLED substrate;

wherein the method of forming the supporter and the hydrophobic wall comprises:

providing a screen printing template having two pattern openings, wherein the shapes of the two openings are corresponding to that of the supporter and the hydrophobic wall;

setting the materials of the supporter and the hydrophobic wall on the screen printing template respectively;

scraping the materials of the supporter and the hydrophobic wall on the screen printing template by scraper to coat the materials into the corresponding openings;

forming a seal; and wherein the material of the exothermic layer is such that it releases heat when it meets water, the heat being sufficient to enable the hydrophobic wall and the supporter to reach a molten state, enabling the molten material to refill and seal any cracks in the seal to eliminate moisture pathways unto the display panel.

2. The method of claim 1, wherein a material of the hydrophobic wall is solution, and after bonding the cover plate and the OLED substrate, the method further comprises:

curing a material of the supporter by UV ray; and drying the cured supporter and a solution of the hydrophobic wall.

3. The method of claim 2, wherein the solution is an organic silicon solution comprising long chain silane coupling agent and a solution of fluorinated alkyl triethoxysilane.

4. The method of claim 2, wherein the solution is a combination of an organic solution and a solution of inorganic compound, wherein the organic solution comprises solution of the precursor having alkoxides of silicon, Titanium, tin, aluminum, or zirconium.

5. A method of packaging an organic light-emitting diode (OLED) display panel, comprising:

providing a cover plate and an OLED substrate, wherein an OLED device is set on the OLED substrate;

forming a supporter and a hydrophobic wall on an outer position of and enclosing the OLED device by screen printing, wherein the hydrophobic wall is on an outer position of the supporter, setting exothermic layers on inner positions of the supporter and the hydrophobic wall respectively, wherein the exothermic layers are sandwiched by the OLED substrate, and the cover plate;

bonding the cover plate and the OLED substrate;

the bonded OLED substrate and the cover plate forming a seal; and wherein the material of the exothermic layer is such that it releases heat when it meets water, the heat being sufficient to enable the hydrophobic wall and the supporter to reach a molten state, enabling the molten material to refill and seal any cracks in the seal to eliminate moisture pathways unto the display panel.

6. The method of claim 5, wherein the method of forming the supporter and the hydrophobic wall comprises:

providing a screen printing template having two pattern openings, wherein the shapes of the two openings are corresponding to that of the supporter and the hydrophobic wall;

setting the materials of the supporter and the hydrophobic wall on the screen printing template respectively; and scraping the materials of the supporter and the hydrophobic wall on the screen printing template by scraper to coat the materials into the corresponding openings.

7. The method of claim 6, wherein a material of the hydrophobic wall is solution, and after bonding the cover plate and the OLED substrate, the method further comprises:

curing a material of the supporter by UV ray; and drying the cured supporter and a solution of the hydrophobic wall.

8. The method of claim 7, wherein the solution is an organic silicon solution comprising long chain silane coupling agent and a solution of fluorinated alkyl triethoxysilane.

9. The method of claim 7, wherein the solution is a combination of an organic solution and a solution of inorganic compound, wherein the organic solution comprises solution of the precursor having alkoxides of silicon, Titanium, tin, aluminum, or zirconium.

10. The method of claim 5, wherein width of the hydrophobic wall is 100-2000 μm.

11. An organic light-emitting diode (OLED) display panel, comprising:

an OLED substrate, wherein an OLED device is formed on the OLED substrate;

a cover plate;

a supporter located on the cover plate and an outer position of the OLED device, wherein the supporter encloses the OLED device when the OLED substrate and the cover plate are bonded;

a hydrophobic wall located on cover plate and an outer position of the supporter, wherein the hydrophobic wall is spaced apart from the supporter;

wherein the exothermic layers are disposed on inner positions of the supporter and the hydrophobic wall respectively;

wherein the exothermic layers are sandwiched by the OLED substrate, and the cover plate;

the bonded OLED substrate and the cover plate forming a seal; and wherein the material of the exothermic layer is such that it releases heat when it meets water, the heat being sufficient to enable the hydrophobic wall and the supporter to reach a molten state, enabling the molten material to refill and seal any cracks in the seal to eliminate moisture pathways unto the display panel.

12. The OLED display panel of claim 11, wherein the hydrophobic wall is formed by an organic silicon solution comprising long chain silane coupling agent and a solution of fluorinated alkyl triethoxysilane.

13. The OLED display panel of claim 11, wherein the hydrophobic wall is formed by a combination of an organic solution and a solution of inorganic compound, wherein the organic solution comprises solution of the precursor having alkoxides of silicon, Titanium, tin, aluminum, or zirconium.

14. The OLED display panel of claim 11, wherein width of the hydrophobic wall is 100-2000 μm.

15. The method of claim 1, wherein the material of the exothermic layer is one of the sodium and magnesium.

16. The method of claim 5, wherein the material of the exothermic layer is one of the sodium and magnesium.

17. The OLED display panel of claim 11, wherein the material of the exothermic layer is one of the sodium and magnesium.

* * * * *